United States Patent [19]
Fucili et al.

[11] Patent Number: 5,789,957
[45] Date of Patent: Aug. 4, 1998

[54] D FLIP-FLOP HAVING ASYNCHRONOUS DATA LOADING

[75] Inventors: Giona Fucili, Magenta; Lorenzo Papillo, Milan; Andrea Pasquino, Vimercate; Annamaria Rossi, Genoa; Alberto Gola, Broni, all of Italy

[73] Assignee: SGS-Thomson Microelectronics, S.r.l., Agrate Brianza, Italy

[21] Appl. No.: 706,407

[22] Filed: Aug. 30, 1996

[30] Foreign Application Priority Data

Aug. 31, 1995 [EP] European Pat. Off. ............ 95830370

[51] Int. Cl.$^6$ .......................... H03K 3/289; H03K 3/26
[52] U.S. Cl. .................. 327/203; 327/202; 327/212
[58] Field of Search ...................... 327/199–202, 327/208–213, 218, 225

[56] References Cited

U.S. PATENT DOCUMENTS 4,970,407  11/1990  Patchen ............................ 307/272.2
5,105,100  4/1992  Yamada ............................. 327/202
5,189,315  2/1993  Akata ............................... 327/212

FOREIGN PATENT DOCUMENTS 0472426    9/1942  European Pat. Off. .
61-79318   4/1986  Japan ............................... 327/212
3-117014   5/1991  Japan ............................... 327/218
5-20791    8/1993  Japan ............................... 327/218

*Primary Examiner*—Timothy P. Callahan
*Assistant Examiner*—T. T. Lam
*Attorney, Agent, or Firm*—Robert Groover; Betty Formby; Matthew S. Anderson

[57] ABSTRACT

A flip-flop of the D type capable of loading data asynchronously and comprising two latches, a master and a slave one, connected in series with each other, is characterized in that each of these comprises an interface and selection circuit for input signals transferable in either the synchronous or the asynchronous manner, and a logic gate circuit which is input such signals and, in an asynchronous manner, control signals effective to establish the latch own states.

25 Claims, 3 Drawing Sheets

D FLIP-FLOP HAVING ASYNCHRONOUS DATA LOADING

CROSS-REFERENCE TO RELATED APPLICATION

This application claims priority from European 95830370.3, filed Aug. 31, 1995 which is hereby incorporated by reference. However, the content of the present application is not necessarily identical to that of the priority application.

BACKGROUND AND SUMMARY OF THE INVENTION

This invention relates to logic networks of the sequential type, and particularly to bistable circuits—more commonly referred to as flip-flops in the pertinent literature—of the D type, conventionally comprised of two cascaded bistable circuits, namely a master and a slave circuit.

Flip-flops of the D type are used to provide a delay in the transmission of data; the propagation of such data from the master section to the slave section only being allowed on the occurrence of a given clock signal.

However, there are applications in which storage elements of the synchronous type, but capable of performing an asynchronous data loading function as well, must be used.

Examples of such applications are the parallel-to-serial converter and the counter with asynchronous data preloading.

A prior technical solution consists of adding a suitable external logic to a D-type flip-flop having "preset" and "set" capabilities, e.g. as in the counters sold under selling code HCC/HCF40192B by this Applicant. (This chips and their data sheets are all hereby incorporated by reference.)

Another prior solution, suitable for use in a wide range of applications and being of greatly simplified design circuit-wise, is disclosed in U.S. Pat. No. 4,970,407, which is hereby incorporated by reference.

A flip-flop of the D type is proposed therein which inherently performs the asynchronous data storage function. Accordingly, the storage element can be a compact one requiring less area of integration on the silicon and effectively avoiding possible problems from the presence of a complementary external logic.

Shown in FIG. 1 of the drawings is a circuit diagram for such a flip-flop which directly permits of asynchronous data loading.

The technical problem underlying this invention is to provide a flip-flop of the D type which also performs the asynchronous data loading function and affords improved control capabilities over prior solutions.

This technical problem is solved by a flip-flop as outlined above and defined in the appended claims.

BRIEF DESCRIPTION OF THE DRAWING

The disclosed inventions will be described with reference to the accompanying drawings, which show important sample embodiments of the invention and which are incorporated in the specification hereof by reference, wherein.

The features and advantages of a flip-flop of the D type according to the invention will be apparent from the following description of an embodiment thereof, given by way of example and not of limitation with reference to the accompanying drawings. In the drawings.

DETAILED DESCRIPTION OF THE PREFERRED EMBODIMENTS

Figure 2:
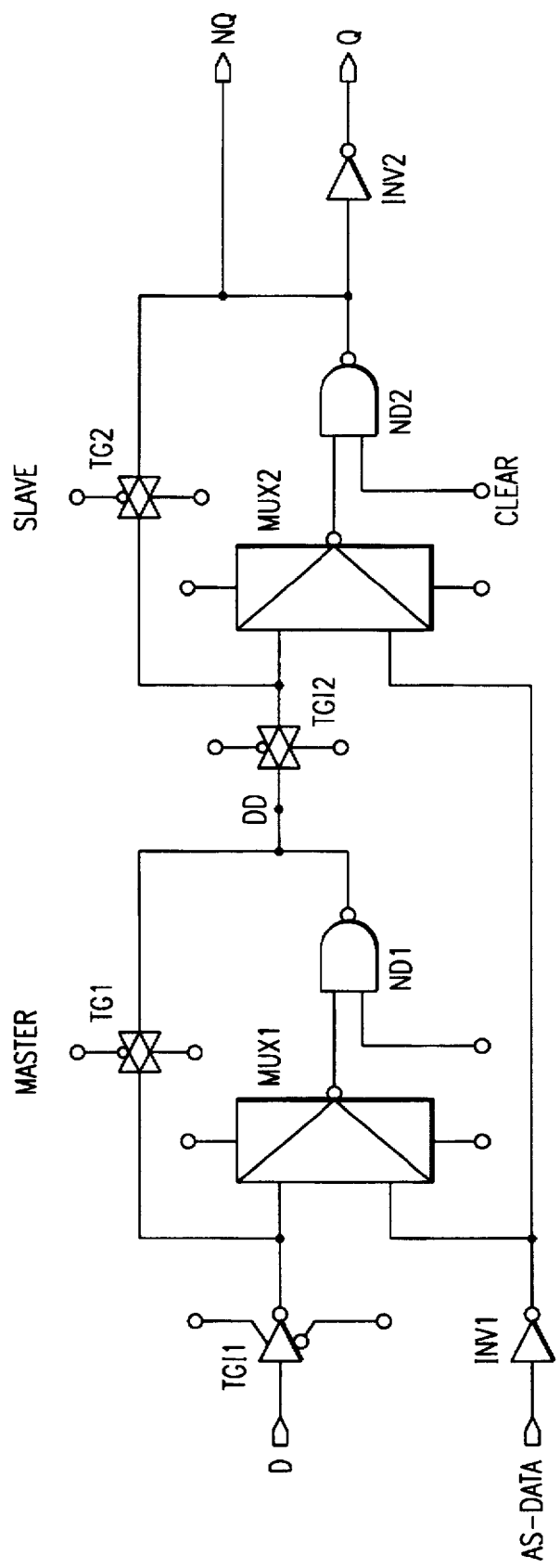
FIG. 2 shows a diagram, partly in block form, of a flip-flop of the D type having an asynchronous data loading function, according to the invention.

The numerous innovative teachings of the present application will be described with particular reference to the presently preferred embodiment (by way of example, and not of limitation), in which:

Shown in FIG. 2 is a circuit diagram of a flip-flop of the D type, according to the invention, which uses a master/slave configuration for data storage. It therefore comprises a first (master) flip-flop for storing the input data and a second (slave) flip-flop supplying the output signal.

Both flip-flops include transmission gating inputs TGI1 and TGI2, respectively, and interface and selection circuits MUX1 and MUX2, respectively, each having a first input terminal connected to a respective transmission gating input.

The two flip-flops further include respective logic gates ND1 and ND2, of the NAND type as shown in the Figure, each having an input terminal connected to the output terminal of the respective interface and selection circuit, the latter being in the form of a multiplexer consisting, for example, of a double buffer tristate with an inverting output and having an output terminal which forms an output terminal of the respective flip-flop.

In accordance with the invention, each of the two logic gates has an input terminal CLEAR which allows the flip-flop comprising it to be driven to a predetermined state by a special active signal, which may be a simple pulse.

In each of the flip-flops, a transmission gate TG1 and TG2, respectively, is negative feedback-connected between the output terminal of the flip-flop and the first input terminal of the interface and selection circuit.

Connected to a second input terminal of each of the two interface and selection circuits MUX1 and MUX2, through a common inverter circuit INV1, is an asynchronous data input terminal AS_DATA.

A second output terminal Q of the D-type flip-flop is provided, additionally to that formed directly by the output terminal NQ of the slave flip-flop, by connecting an inverter circuit INV2 to a circuit node thereof.

In accordance with the invention, the transmission gating input TGI1 of the master flip-flop is of the inverting type, in order to regenerate the signal applied to the input terminal D of the D-type flip-flop.

The transmission gating input TGI1 can be a buffer tristate with a high-impedance separating and uncoupling function.

All the transmission gates and interface/selection circuits are driven by clock signals.

Figure 3:
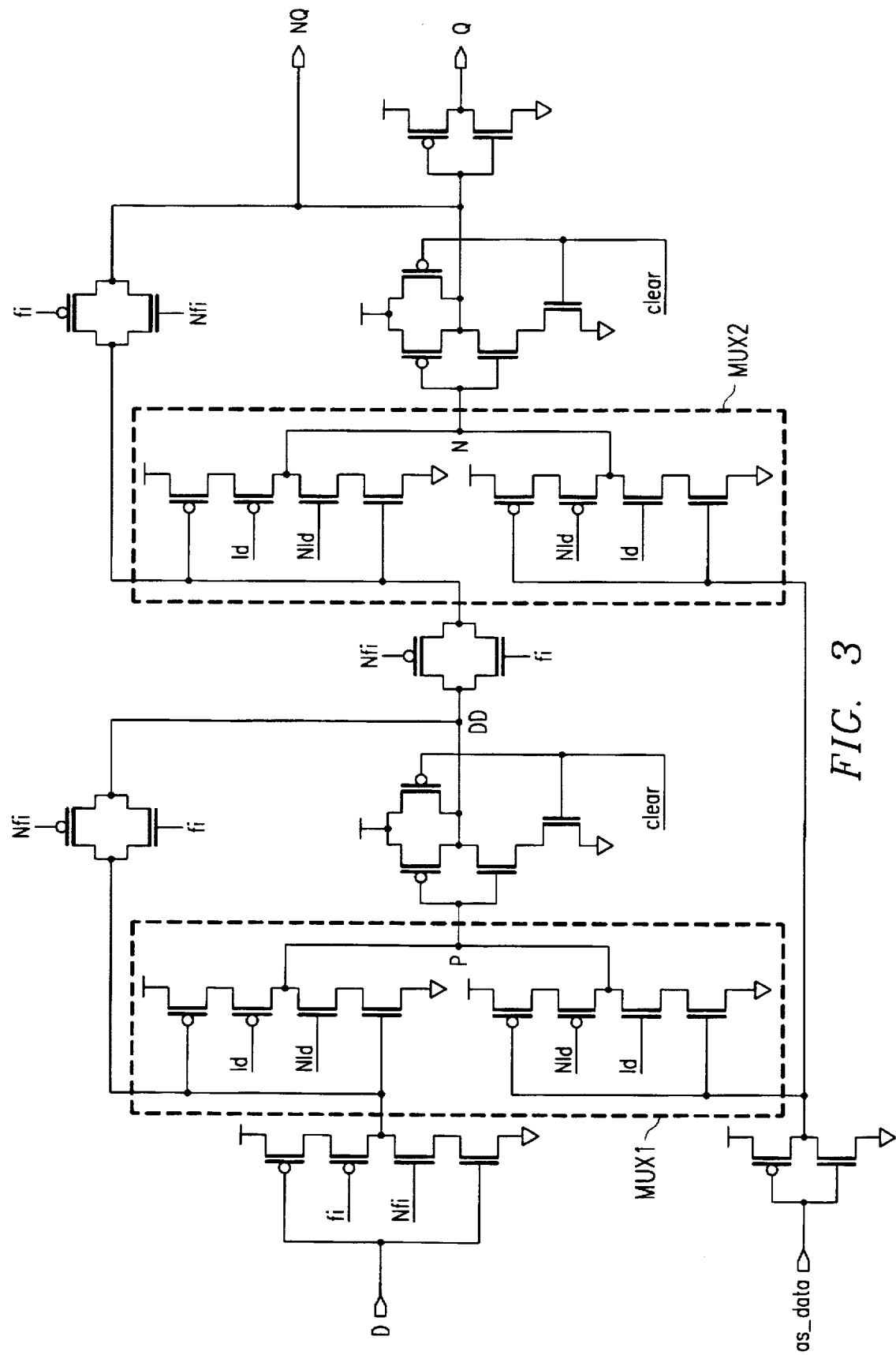
FIG. 3 shows a circuit diagram for a possible implementation of same.

In an implementation with CMOS technology of a D-type flip-flop according to the invention, e.g. as illustrated by the circuit diagram in FIG. 3, the clock signal is split into two signals fi and Nfi; fi being in phase with the clock, and Nfi in phase opposition therewith. Likewise, the asynchronous load signal is split into 1d and N1d (the loading becoming active on the high logic level).

The operation of the flip-flop in the instance of a positive edge triggered clock signal will be considered. The negative edge triggering function is obtained by exchanging Nfi for fi. It is likewise possible to obtain the asynchronous data loading on a different logic level from that under consideration by exchanging N1*d* for 1*d*.

Let us consider now normal operation as a flip-flop of the D type, the assumption being that the load signal id is always at a logic low.

When fi is at a low logic level (so that Nfi will be at a logic high), the data present at D are accepted by the master flip-flop. For example, if D=1, upon fi becoming low DD=0 will appear at the input terminal of the slave flip-flop, but this level has no effect on the slave because with fi low, the transmission gate TGI2 is disabled, so that the previously stored value will still be output.

Since DD is also the slave flip-flop input, upon fi becoming high, the data present at the transmission gate TGI2 will be transferred to the slave output, so that Q=1.

To summarize, when fi is low, the data present at the input terminal D is read by the master but cannot be passed on to the slave. As the clock signal is restored to its logic high, thereby disabling the gating input, the data stored in the master is read by the slave flip-flop and will appear at the outputs Q and NQ.

On the other hand, when a master/slave flip-flop must be allowed to have asynchronous direct inputs, these should be connected to both the master and the slave, so as to "bypass" the clock signal (fi, Nfi). The load signal enables storage, into both the master and slave flip-flops, of the data which appears asynchronously at the input AS_DATA.

When the load signal is at its logic low, the flip-flop operates normally as a positive edge triggered D.

As 1*d* becomes high, the multiplexers MUX1 and MUX2 will carry to the nodes P and N the logic value present at the input AS_DATA.

The asynchronous input is left unheeded upon the signal 1*d* being restored to its logic low; in this case, the asynchronous data is still held at the output by one of the two feedback loops of the master and the slave, according to the value of fi. The master and slave inputs become active once again, so that the new data will be sampled at the first useful edge of the clock signal.

Furthermore, the circuit arrangement including the two logic gates ND1 and ND2 allows the low logic level to be forced asynchronously out by the application of a special low active signal to the terminals CLEAR of the gates.

Inverters may be placed on the outputs Q and NQ of the flip-flop in order to output regenerated signals having high driving capabilities.

This also allows the value of the data stored into the feedback loop of the slave to be saved, since the output is electrically isolated against noise from downstream circuitry of the flip-flop.

It should be understood that modifications or substitutions may be made unto the embodiment described, in ways well known to the skilled ones in the art. For example, the NAND logic gates could be replaced with other logic circuits to suit specific implementations of the other feedback loops of the bistable circuits.

According to one disclosed class of innovative embodiments, there is provided an integrated D-type flip-flop circuit, comprising: an inverting transmission gate, connected to receive a D input and to provide an output signal only during a first clock phase, said output signal being the complement of said D input; a first multiplexer, connected at a first input thereof to receive said output signal, connected at a second input thereof to receive an inverted asynchronous-data signal, and connected to provide a first selected data output which is selected from said first and second inputs in accordance with a load control signal; a first feedback transmission gate, connected to apply said first selected data output to said first input of said first multiplexer during a second clock phase; a first clearing gate, connected to unconditionally drive said first selected data output into a cleared state whenever a clear signal goes active; an intermediate non-inverting transmission gate, connected to pass said first selected data output through to an output during said second clock phase; a second multiplexer, connected at a first input thereof to receive said output of said intermediate transmission gate, connected at a second input thereof to receive said inverted asynchronous-data signal, and connected to provide a second selected data output which is selected from said first and second inputs in accordance with said load control signal; a second feedback transmission gate, connected to apply said second selected data output to said first input of said second multiplexer during said first clock phase; a second clearing gate, connected to unconditionally drive said second selected data output into said cleared state whenever said clear signal goes active; and an output inverter, connected to invert said second selected data output to provide a Q output.

According to another disclosed class of innovative embodiments, there is provided a sequential logic network, having at least first and second signal input terminals and an output terminal, comprising: an input bistable circuit having an interface and selection circuit which has a first input terminal connected to the first input terminal of the network through an input gate for the transmission of signals, and a second input terminal coupled to the second input terminal of the network, said input bistable circuit comprising a first logic gate circuit having a first input terminal connected to an output terminal of the first interface and selection circuit, a second input terminal for control signals, an output terminal connected to an output node of said input bistable circuit, and a first feedback transmission gate connected between the output terminal of said first logic gate circuit and the first input terminal of the first interface and selection circuit; and an output bistable circuit, connected in series with said input bistable circuit between said first input and said output terminal of the network, having a second interface and selection circuit which has a first input terminal coupled to an output node of the input bistable circuit through a second gate for the transmission of input signals, and a second input terminal coupled to the second input terminal of the network, said output bistable circuit comprising a second logic gate circuit having a first input terminal connected to an output terminal of the second interface and selection circuit, a second input terminal for control signals and a network output terminal, a second feedback transmission gate connected between the output terminal of said second logic gate circuit and the first input terminal of the second interface and selection circuit.

According to another disclosed class of innovative embodiments, there is provided a logic network of the sequential type, having at least first and second signal input terminals and an output terminal and comprising an input bistable circuit and an output bistable circuit, connected in series with each other between the first input and the output terminal of the network, the input bistable circuit including an interface and selection circuit which has a first input terminal connected to the first input terminal of the network through an input gate for the transmission of signals, and a second input terminal coupled to the second input terminal of the network, the output bistable circuit including a second interface and selection circuit which has a first input terminal coupled to an output node of the input bistable circuit through a second gate for the transmission of input signals, and a second input terminal coupled to the second input terminal of the network, characterized in that the input bistable circuit comprises a first logic gate circuit having a first input terminal connected to an output terminal of the first interface and selection circuit, a second input terminal for control signals and an output terminal connected to an output node of said input bistable circuit, and comprises a first feedback transmission gate connected between the output terminal of said first logic gate circuit and the first input terminal of the first interface and selection circuit, and in that the output bistable circuit comprises a second logic gate circuit having a first input terminal connected to an output terminal of the second interface and selection circuit, a second input terminal for control signals and a network output terminal, and comprises a second feedback transmission gate connected between the output terminal of said second logic gate circuit and the first input terminal of the second interface and selection circuit.

According to another disclosed class of innovative embodiments, there is provided a flip-flop of the D type, comprising: a master latch; and a slave latch connected in series with said master latch; wherein each of said latches comprises an interface and selection circuit for signals transferable in either the synchronous or the asynchronous manner, and a logic gate circuit which is input said signals and, in the asynchronous manner, control signals effective to establish the latch own states.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, other circuit elements can be added to, or substituted into, the specific circuit topologies shown.

What is claimed is:

1. An integrated D-type flip-flop circuit, comprising:

an inverting transmission gate, connected to receive a D input and to provide an output signal only during a first clock phase, said output signal being the complement of said D input;

a first multiplexer, connected at a first input thereof to receive said output signal, connected at a second input thereof to receive an inverted asynchronous-data signal, and connected to provide a first selected data output which is selected from said first and second inputs in accordance with a load control signal;

a first feedback transmission gate, connected to apply said first selected data output to said first input of said first multiplexer during a second clock phase;

a first clearing gate, connected to unconditionally drive said first selected data output into a cleared state whenever a clear signal goes active;

an intermediate non-inverting transmission gate, connected to pass said first selected data output through to an output during said second clock phase;

a second multiplexer, connected at a first input thereof to receive said output of said intermediate non-inverting transmission gate, connected at a second input thereof to receive said inverted asynchronous-data signal, and connected to provide a second selected data output which is selected from said first and second inputs in accordance with said load control signal;

a second feedback transmission gate, connected to apply said second selected data output to said first input of said second multiplexer during said first clock phase;

a second clearing gate, connected to unconditionally drive said second selected data output into said cleared state whenever said clear signal goes active; and an output inverter, connected to invert said second selected data output to provide a Q output.

2. An integrated D-type flip-flop circuit according to claim 1, wherein said first and second clearing gates are of the NAND type.

3. An integrated D-type flip-flop circuit according to claim 1, wherein said inverting transmission gate and said intermediate non-inverting transmission gate, and said first and second feedback transmission gates, are controlled by at least one clock signal and synchronized in a predetermined manner.

4. An integrated D-type flip-flop circuit according to claim 1, wherein said first and second multiplexers are effective to transfer, in an asynchronous manner, signals applied to said second input of each of said first and second multiplexers.

5. An integrated D-type flip-flop circuit according to claim 1, wherein said first and second clearing gates are coupled to receive said load control signal in an asynchronous manner.

6. An integrated D-type flip-flop circuit according to claim 1, wherein it is integrated monolithically with CMOS technology.

7. A sequential logic network, having at least first and second signal input terminals and an output terminal, comprising:

an input bistable circuit having a first multiplexing circuit which has a first input terminal connected to the first input terminal of the sequential logic network through a first input gate for the transmission of signals, and a second input terminal coupled to the second input terminal of the sequential logic network, a first logic gate circuit having a first input terminal connected to an output terminal of the first multiplexing circuit, a second input terminal for receiving a first control signal, an output terminal connected to an output node of the input bistable circuit, and a first feedback transmission gate connected between the output terminal of the first logic gate circuit and the first input terminal of the first multiplexing circuit; and an output bistable circuit, connected in series with the input bistable circuit between the first signal input terminal and the output terminal of the sequential logic network, having a second multiplexing circuit which has a first input terminal coupled to said output node of the input bistable circuit through a second input gate for the transmission of signals, and a second input terminal coupled to the second input terminal of the sequential logic network, a second logic gate circuit having a first input terminal connected to an output terminal of the second multiplexing circuit, a second input terminal for receiving said first control signal and an output terminal, a second feedback transmission gate connected between the output terminal of the second logic gate circuit and the first input terminal of the second multiplexing circuit.

8. A sequential logic network according to claim 7, wherein the first input gate for the transmission of signals is a circuit having a high-impedance separating function.

9. A sequential logic network according to claim 7, wherein the first and second logic gate circuits are of the NAND type.

10. A sequential logic network according to claim 7, wherein the first and second input gates for the transmission of signals, and the first and second feedback transmission gates, are controlled by clock signals as synchronized in a predetermined manner.

11. A sequential logic network according to claim 7, wherein the first and second multiplexing circuits are effective to transfer, in an asynchronous manner, signals applied to the second input terminal of the sequential logic network.

12. A sequential logic network according to claim 7, wherein the first and second logic gate circuits are coupled to receive said first control signal in an asynchronous manner.

13. A sequential logic network according to claim 12, wherein it is integrated monolithically with CMOS technology.

14. A logic network of the sequential type, having at least first and second signal input terminals and an output terminal and comprising an input bistable circuit and an output bistable circuit, connected in series with each other between the first input and the output terminal of the logic network, the input bistable circuit including
a first multiplexing circuit which has a first input terminal connected to the first input terminal of the logic network through a first input gate for the transmission of signals, and a second input terminal coupled to the second input terminal of the logic network, the output bistable circuit including
a second multiplexing circuit which has a first input terminal coupled to an output node of the input bistable circuit through a second input gate for the transmission of signals, and a second input terminal coupled to the second input terminal of the logic network, wherein the input bistable circuit further comprises
a first logic gate circuit having a first input terminal connected to an output terminal of the first multiplexing circuit,
a second input terminal for receiving a control signal and
an output terminal connected to said output node of the input bistable circuit, and the input bistable circuit further comprises
a first feedback transmission gate connected between the output terminal of the first logic gate circuit and the first input terminal of the first multiplexing circuit, and in that the output bistable circuit further comprises
a second logic gate circuit having a first input terminal connected to an output terminal of the second multiplexing circuit,
a second input terminal for receiving said control signal and an output terminal, and the output bistable circuit further comprises
a second feedback transmission gate connected between the output terminal of the second logic gate circuit and the first input terminal of the second multiplexing circuit.

15. A logic network according to claim 14, wherein the first input gate for the transmission of signals is a circuit having a high-impedance separating function.

16. A logic network according to claim 14, wherein the first and second logic gate circuits are of the NAND type.

17. A logic network according to claim 14, wherein the first and second input gates for the transmission of signals, and the first and second feedback transmission gates, are controlled by clock signals as synchronized in a predetermined manner.

18. A logic network according to claim 14, wherein the first and second multiplexing circuits are effective to transfer, in an asynchronous manner, signals applied to the second input terminal of the logic network.

19. A logic network according to claim 14, wherein the first and second logic gate are coupled to receive said control signal in an asynchronous manner.

20. A logic network according to claim 14, wherein it is integrated monolithically with CMOS technology.

21. A flip-flop of the D type, comprising:
a master latch; and
a slave latch connected in series with said master latch;
wherein each of said latches comprises
a multiplexing circuit for signals transferable in either the synchronous or the asynchronous manner; and
a logic gate circuit which is input said signals and, in the asynchronous manner, a control signal effective to establish the latch on states of said logic gate circuit.

22. A flip-flop of the D type according to claim 21, wherein said logic gate circuit of said master latch is of the NAND type.

23. A flip-flop of the D type according to claim 21, wherein said logic gate circuit of said slave latch is of the NAND type.

24. A counter device comprising:
at least one logic network having at least first and second signal input terminals and an output terminal, comprising
an input bistable circuit having a first multiplexing circuit which has a first input terminal connected to the first input terminal of the logic network through a first input gate for the transmission of signals, and a second input terminal coupled to the second input terminal of the logic network, and wherein the first input gate for the transmission of signals is a circuit having a high-impedance separating function,
a first logic gate circuit having a first input terminal connected to an output terminal of the first multiplexing circuit;
a second input terminal for receiving a first control signal;
an output terminal connected to an output node of the input bistable circuit; and
a first feedback transmission gate connected between the output terminal of the first logic gate circuit and the first input terminal of the first multiplexing circuit; and
an output bistable circuit, connected in series with the input bistable circuit between the first signal input terminal and the output terminal of the logic network, having a second multiplexing circuit which has a first input terminal coupled to said output node of the input bistable circuit through a second input gate for the transmission of signals and a second input terminal coupled to the second input terminal of the logic network, a second logic gate circuit having a first input terminal connected to an output terminal of the second multiplexing circuit;

a second input terminal for receiving said first control signal and an output terminal;

a second feedback transmission gate connected between the output terminal of the second logic gate circuit and the first input terminal of the second multiplexing circuit.

25. A parallel-to-serial converter device comprising:

at least one logic network having at least first and second signal input terminals and an output terminal, comprising an input bistable circuit having a first multiplexing circuit which has a first input terminal connected to the first input terminal of the logic network through a first input gate for the transmission of signals, and a second input terminal coupled to the second input terminal of the logic network, and wherein the first input gate for the transmission of signals is a circuit having a high-impedance separating function, a first logic gate circuit having a first input terminal connected to an output terminal of the first multiplexing circuit;

a second input terminal receiving a first control signal, an output terminal connected to an output node of the input bistable circuit; and a first feedback transmission gate connected between the output terminal of the first logic gate circuit and the first input terminal of the first multiplexing circuit; and an output bistable circuit, connected in series with the input bistable circuit between the first signal input terminal and the output terminal of the logic network, having a second multiplexing circuit which has a first input terminal coupled to said output node of the input bistable circuit through a second input gate for the transmission of signals, and a second input terminal coupled to the second input terminal of the logic network, a second logic gate circuit having a first input terminal connected to an output terminal of the second multiplexing circuit;

a second input terminal for receiving said first control signal and an output terminal;

a second feedback transmission gate connected between the output terminal of the second logic gate circuit and the first input terminal of the second multiplexing circuit.

* * * * *

UNITED STATES PATENT AND TRADEMARK OFFICE
CERTIFICATE OF CORRECTION

PATENT NO. : 5,789,957
DATED : August 4, 1998
INVENTOR(S) : Giona Fucili, Lorenzo Papillo, Andrea Pasquino, Annamaria Rossi, and Alberto Gola It is certified that error appears in the above-identified patent and that said Letters Patent is hereby corrected as shown below:

TITLE PAGE, ITEM [30], FOREIGN APPLICATION DATA:

Strike:

" 95830370 "

Insert:

-- 95830370.3 --

UNITED STATES PATENT AND TRADEMARK OFFICE
CERTIFICATE OF CORRECTION

PATENT NO. : 5,789,957
DATED : August 4, 1998
INVENTOR(S) : Giona Fucili, Lorenzo Papillo, Andrea Pasquino, Annamaria Rossi, and Alberto Gola Page 2 of 2

It is certified that error appears in the above-identified patent and that said Letters Patent is hereby corrected as shown below:

IN THE DRAWINGS

Figure 1:
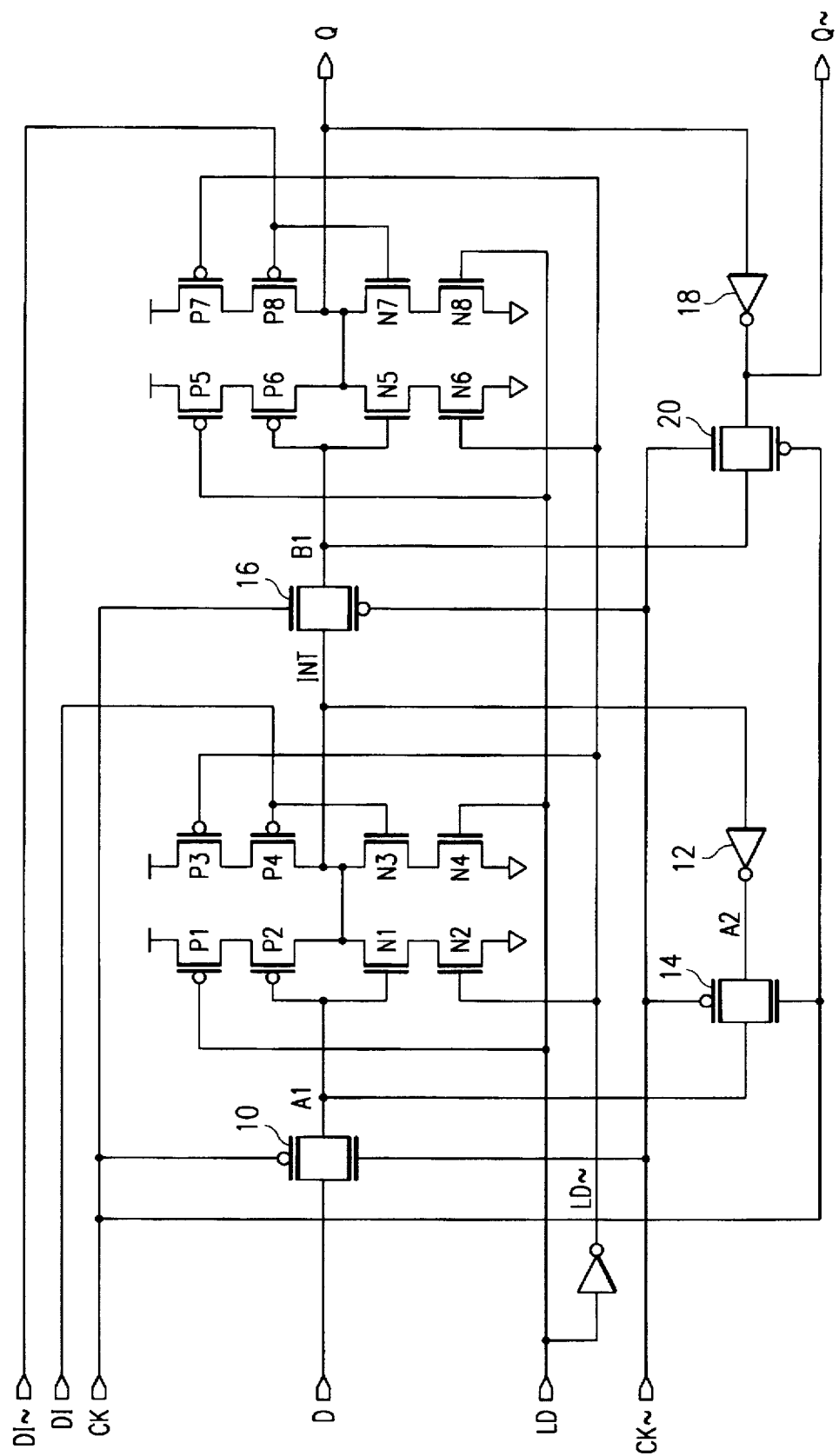
FIG. 1 shows a prior art circuit diagram for a flip-flop of the D type having an asynchronous data loading function.

Strike Figure 1:

Insert:

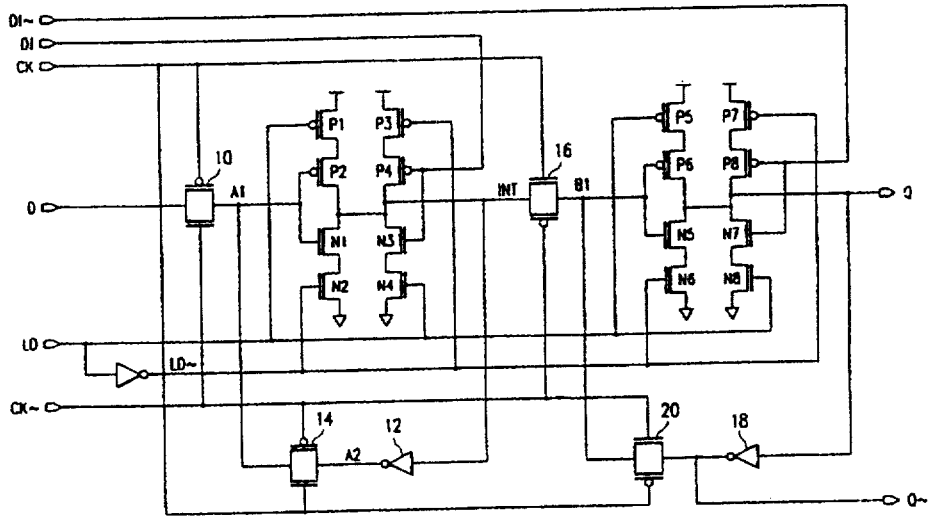

FIG. 1
(PRIOR ART)

Signed and Sealed this

Nineteenth Day of January, 1999

Attest:

Attesting Officer

*Acting Commissioner of Patents and Trademarks*